(12) United States Patent
Scott et al.

(10) Patent No.: US 6,531,925 B2
(45) Date of Patent: Mar. 11, 2003

(54) HETEROJUNCTION BIPOLAR TRANSISTOR OPTOELECTRONIC TRANSIMPEDANCE AMPLIFIER USING THE FIRST TRANSISTOR AS AN OPTICAL DETECTOR

(76) Inventors: David C. Scott, 11332 E. 214th St., Lakewood, CA (US) 90715; Timothy A. Vang, 1004 Calle Carrillo, San Dimas, CA (US) 91773; Srinath Kalluri, 22681 Oak Grove Ave. #325, Aliso Viejo, CA (US) 92656

( * ) Notice: Subject to any disclaimer, the term of this patent is extended or adjusted under 35 U.S.C. 154(b) by 0 days.

(21) Appl. No.: 09/907,340

(22) Filed: Jul. 17, 2001

(65) Prior Publication Data

US 2003/0016084 A1 Jan. 23, 2003

(51) Int. Cl.[7] .................................................. H03F 3/08
(52) U.S. Cl. .................... 330/308; 327/514; 250/214 A
(58) Field of Search .................... 330/308; 327/514; 250/214 A; 359/189, 194

(56) References Cited

U.S. PATENT DOCUMENTS

| | | | | |
|---|---|---|---|---|
| 3,850,809 A | * | 11/1974 | Mannonen | 250/214 |
| 4,037,120 A | * | 7/1977 | Colardelle et al | 327/514 |
| 4,090,149 A | * | 5/1978 | Krause | 330/308 |
| 4,306,145 A | * | 12/1981 | Hill | 250/214 A |
| 4,878,254 A | * | 10/1989 | Richardson | 250/214 A |
| 5,043,587 A | * | 8/1991 | Miki et al. | 250/214 A |

* cited by examiner

Primary Examiner—Tuan T. Lam
(74) Attorney, Agent, or Firm—Parsons & Goltry; Robert A. Parsons; Michael W. Goltry

(57) ABSTRACT

A monolithically integrated heterojunction bipolar transistor optoelectronic transimpedance amplifier using the first transistor as an optical detector. An edge illuminated epilayer waveguide phototransistor is used as the light-detecting element. The phototransistor is used as an optical detector in which the incident light pulses are converted to electrical pulses and then amplified for further signal processing. The phototransistor is monolithically integrated on the same material substrate as the emitter follower amplifier so that the parasitics normally associated with receiver circuitry are minimized. By eliminating the parasitic impedances, the circuit can be used as a receiver in high bit rate optical communication systems.

6 Claims, 3 Drawing Sheets

HETEROJUNCTION BIPOLAR TRANSISTOR OPTOELECTRONIC TRANSIMPEDANCE AMPLIFIER USING THE FIRST TRANSISTOR AS AN OPTICAL DETECTOR

FIELD OF THE INVENTION

This invention relates to phototransistors.

More particularly, the present invention relates to edge illuminated heterojunction bipolar phototransistors (HBPTs).

BACKGROUND OF THE INVENTION

As the bit rates of telecommunication and datacom systems increase, the demands on the performance requirements of photoreceivers increase. Particularly at bit rates of 10 Gbit/s and 40 Gbit/s, the design of the photoreceiver to achieve these high speeds relies on the ability to reduce the size of the circuit elements and to reduce the parasitic capacitances and inductances throughout the circuit. In typical front-end receivers, some form of photodetector, usually a pin diode, avalanche photodetector, or metal-semiconductor-metal detector needs to be used to convert the incident light pulses into electrical signals. A subsequent transimpedance amplifier then amplifies the electrical signal output of the detector. The output signal needs to be strong so that it can be further processed by a clock and data recovery circuit. For high speeds, it is critical to minimize the internal capacitances and resistances of the aforementioned photodetector. It is also critical to minimize the parasitic capacitances and inductances that arise due to the need to connect the photodetector to the input of the transimpedance amplifier (TIA). In particular, the parasitic inductance associated with this interconnection can significantly impact the overall performance of the front-end receiver by reducing the transimpedance gain and causing circuit instability.

It would be highly advantageous, therefore, to remedy the foregoing and other deficiencies inherent in the prior art.

Accordingly, it is an object of the present invention to provide a new and improved heterojunction bipolar transistor optoelectronic transimpedance amplifier using the first transistor as an optical detector.

It is an object of the present invention to provide a new and improved heterojunction bipolar transistor optoelectronic transimpedance amplifier which decreases the excessive parasitic losses associated with having external electrical contacts.

It is another object of the present invention to provide a new and improved heterojunction bipolar transistor optoelectronic transimpedance amplifier which is monolithically integrated on a semiconductor substrate.

A further object of the invention is to provide a new and improved heterojunction bipolar transistor optoelectronic transimpedance amplifier which has the ability to perform at bit rates greater than 40 Gbits/second.

SUMMARY OF THE INVENTION

To achieve the objects and advantages specified above and others, a heterojunction bipolar transistor optoelectronic transimpedance amplifier using the first transistor as an optical detector is disclosed. The optoelectronic transimpedance amplifier is formed on a semiconductor substrate. The transimpedance amplifier contains an input phototransistor for receiving incident optical signals and converting the optical signals to electrical signals.

In the preferred embodiment, the transimpedance amplifier comprises a simple local shunt feedback circuit with an emitter follower. The transimpedance amplifier contains an input transistor and an output transistor. In the preferred embodiment, the input transistor is an edge illuminated waveguide phototransistor that includes a subcollector layer formed from an epitaxially grown quaternary semiconductor material. The epitaxially grown quaternary semiconductor material improves the optical waveguide mode properties. A collector region is epitaxially grown on the subcollector layer. A base region, which contains a very thin spacer layer, is epitaxially grown on the collector layer. An emitter region is then epitaxially grown on the base layer. The various layers and regions are formed so as to define an edge-illuminated facet for receiving incident light. Further, ohmic contacts are formed to the subcollector, base, and emitter regions to allow electrical signals to be applied to the phototransistor.

In a preferred embodiment, the first transistor consists of a semiconductor region that can absorb incident optical radiation centered around wavelengths of 1.55 $\mu$m. All of the elements of the transimpedance amplifier circuit are formed on the same substrate, which eliminates the need to use a separate photodetection element. Also, the associated parasitic impedances that arise from connecting the photodetector to the input of the transimpedance amplifier circuit are eliminated. By forming the entire circuit on the same substrate, the amplifier acts as an inexpensive and monolithically integrated front-end optical receiver that is suitable for high-speed optical communication systems.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

Figure 1:
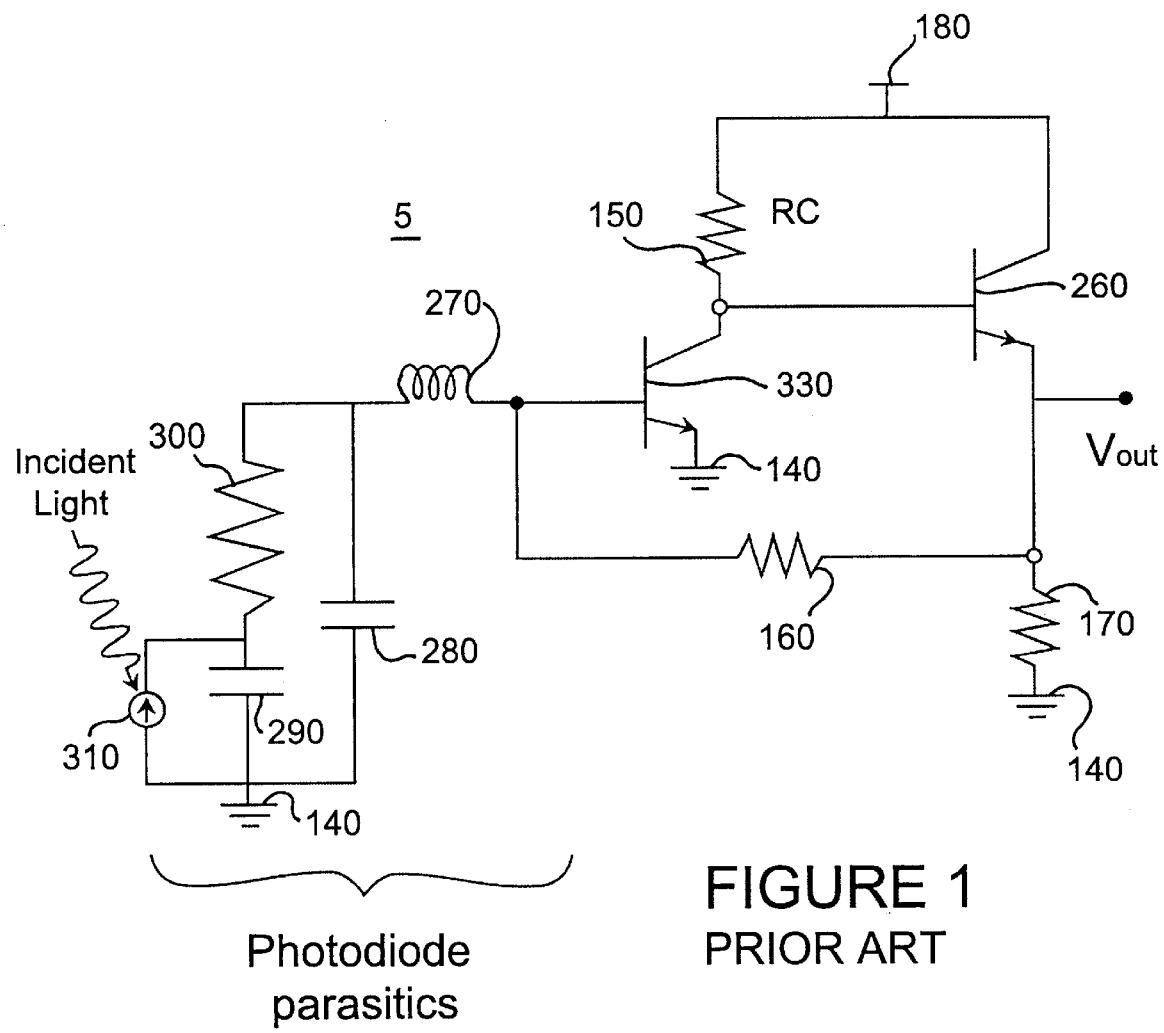
FIG. 1 is a circuit schematic illustrating the circuitry used in the prior art.

Turn now to FIG. 1, which illustrates a simplified photodiode and transimpedance amplifier circuit schematic 5 typically used in the prior art. The simplified photodiode and transimpedance amplifier circuit schematic 5 includes a photodiode 320, which is modeled as a photocurrent source 310, a photodiode series resistance 300, and a photodiode junction capacitance 290. Photocurrent source 310 generates a photocurrent that is sensitive to the incident light. Photodiode 320 is connected to the base of a bipolar junction transistor (BJT) 350, which serves as the input to the transimpedance amplifier circuit. Photodiode 320 is connected to the base of bipolar junction transistor 350 through parasitic inductance 270 and parasitic capacitance 280.

Parasitic inductance 270 and parasitic capacitance 280 are caused by the external contacts used to connect photodiode 320 to the transimpedance amplifier circuit. Parasitic impedances drastically affect the performance of the amplifier circuit by reducing the amplifier gain and causing circuit instabilities. Parasitic impedances are also highly undesirable because they represent circuit elements that are extremely difficult to characterize and control. As a result, the performance of one amplifier circuit can be significantly different from that of another, supposedly identical amplifier circuit. Thus, eliminating excessive parasitic impedances becomes important for high frequency circuits used in high bit rate optical communication systems.

The transimpedance amplifier circuit used in this illustration consists of a heterojunction bipolar input transistor 350 and output transistor 260. Also included in the transimpedance amplifier circuit is a collector resistor 150, a feedback resistor 160, an emitter resistor 170, a voltage source 180, and an electrical ground 140. The purpose of these circuit elements in an amplifier is readily apparent to those skilled in the art. In this embodiment, the transimpedance amplifier uses a simple local shunt feedback with emitter follower.

Figure 2:
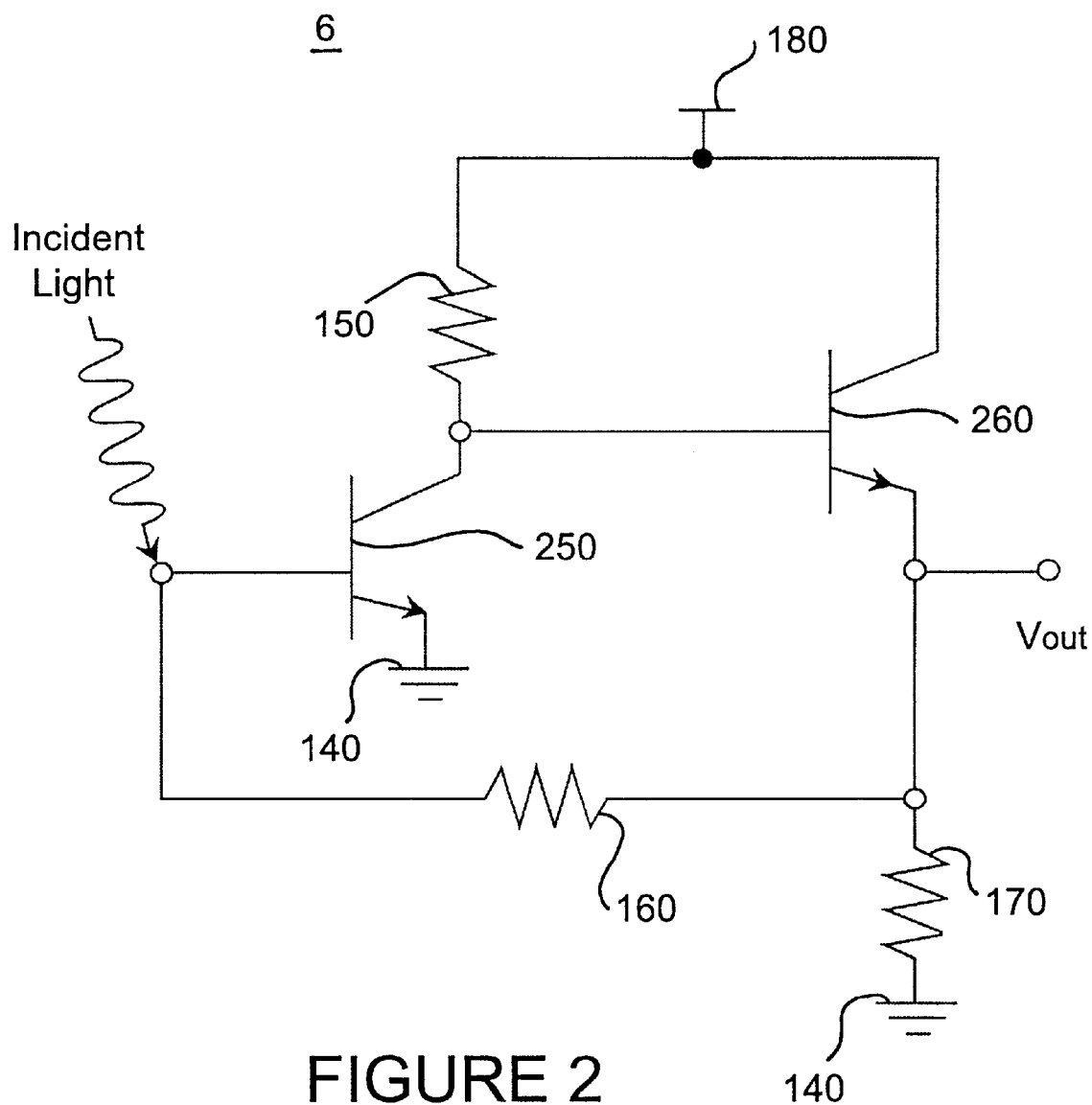
FIG. 2 is a circuit schematic illustrating the circuitry used in accordance with the present invention.

Referring now to FIG. 2, an integrated optoelectronic amplifier 6 is illustrated schematically. In this preferred embodiment, integrated optoelectronic amplifier 6 consists of a transimpedance amplifier that uses a simple local shunt feedback with an emitter follower. It will be understood that other amplifier circuits could be used. Integrated optoelectronic amplifier 6 contains a phototransistor 250 for the input transistor. The emitter of phototransistor 250 is connected to an electrical ground 140, the base is connected to the first terminal of a feedback resistor 160, and the collector is connected to the first terminal of a collector resistor 150 and also to the base of an output transistor 260. The collector of output transistor 260 is connected to the second terminal of collector resistor 150, which is also connected to a voltage source 180. The emitter of the output transistor 260, which provides an electrical output signal, is connected to the second terminal of feedback resistor 160 and also to the first terminal of an emitter resistor 170. The second terminal of the emitter resistor 170 is connected to the electrical ground 140.

Figure 3:
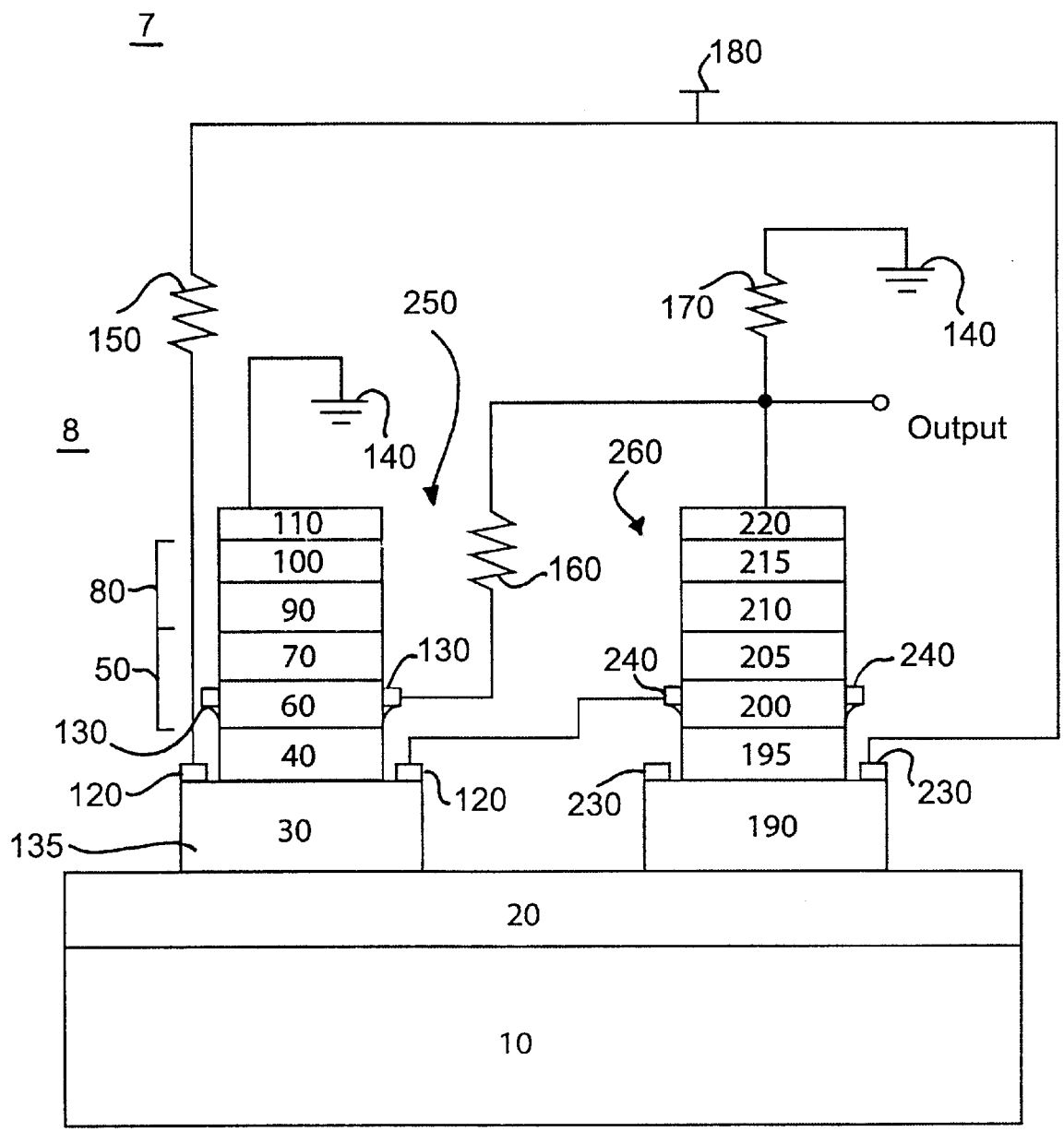
FIG. 3 is a sectional view illustrating the layer structure of the phototransistor and transimpedance amplifier used in accordance with the present invention.

Turn now to FIG. 3, which illustrates a simplified sectional view of the layer structure of the phototransistor and transimpedance amplifier circuit 7. The elements illustrated in FIG. 3 are identical to those shown in FI-G. 2, but are shown from a different perspective. In this embodiment, phototransistor 250 is an edge illuminated epilayer waveguide phototransistor 80. More information as to the edge illuminated epilayer waveguide phototransistor 80 can be found in a copending U.S. Patent Application entitled "Three Terminal Edge Illuminated Epilayer Waveguide Phototransistor" filed of even date herewith and incorporated herein by reference. It should be emphasized that the three terminal edge illuminated epilayer waveguide phototransistor 80 is formed on a substrate 10 as is the heterojunction bipolar output transistor 220. It will also be emphasized that the resistor elements illustrated are also formed monolithically on substrate 10, but are shown otherwise for simplicity. A buffer layer 20 can be included to provide a pristine surface onto which the device structure can be grown with minimal defects. It will be understood that buffer layer 20 can be the same material as substrate 10 or can be composed of an alloy to allow lattice matching to subsequent layers grown thereon. The subcollector layer, the collector layer, the base region and the emitter region of edge illuminated epilayer waveguide phototransistor 80 are formed so as to define an edge illuminated facet 135 for receiving incident light. It will be understood that many different configurations can be used to produce the base and emitter regions of the edge illuminated epilayer waveguide phototransistor 80, including using multiple layers of various semiconductor alloys or by using different doping configurations.

It will also be understood that the transimpedance amplifier circuit in the preferred embodiment is based on the InP/InGaAsP material system, but other material systems are also suitable. In this embodiment, InP based phototransistors allow the absorption of light having an optical wavelength of 1.55 $\mu$m, which is the wavelength of interest for current telecommunication systems. However, other material systems may be more appropriate for other optical wavelengths.

Heterojunction bipolar output transistor 260 is comprised of the same epilayers as phototransistor 250. This allows for monolithic integration of the waveguide phototransistor with the subsequent heterojunction bipolar output transistor using standard epitaxial growth and subsequent wafer processing procedures. It will be understood that heterojunction bipolar output transistor 260 can have different epilayers than is phototransistor 250. The processing steps used to form the electrical connections to the various circuit elements are readily known to those skilled in the art.

It should be made clear that in this embodiment, all of the circuit elements are now monolithically integrated on the same substrate. By removing photodiode 320, parasitic inductance 270 and parasitic capacitance 280 are also removed because external contacts have been eliminated. The parasitic losses and instabilities associated with electrically connecting a separate photodetector to the input of the transimpedance amplifier have been eliminated. The performance of the electro-optic transimpedance amplifier is now enhanced and more predictable. In this embodiment, a simple transimpedance amplifier circuit is illustrated for simplicity, but it should be understood that the transimpedance amplifier could be one of many different circuit topologies readily known to those skilled in the art. For example, a transimpedance amplifier comprising a shunt feedback with a Darlington second stage can be used.

A simple transimpedance amplifier circuit has an input and an output transistor. In this embodiment, however, the input transistor is replaced with a phototransistor as the element that converts the incident optical signal to the electrical signal, thereby eliminating the need for a separate photodetector element. This eliminates the parasitic losses associated with the separate photodetector element and also eliminates the parasitic losses and instabilities associated with electrically connecting this separate photodetector to the input of the transimpedance amplifier. The elimination of the separate photodetector element and its associated excess parasitics becomes important for high frequency circuits, such as those currently needed to fulfill the needs of high bit rate optical communication systems. This is especially needed for bit rates of 40 Gbps and above.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same,

The invention claimed is:

1. An electro-optic amplifier comprising:
   a semiconductor substrate; and
   a light sensitive transistor amplifier, including an edge-illuminated phototransistor, formed on the semiconductor substrate for receiving an optical signal and providing an amplified electrical signal, the edge-illuminated phototransistor including
a subcollector layer formed of an epitaxially grown quaternary semiconductor,
a collector region epitaxially grown on the subcollector layer,
a base region epitaxially grown on the collector region,
an emitter region epitaxially grown on the base region, and
the subcollector layer, the collector region, the base region, and the emitter region being formed so as to define an edge illuminated facet for receiving incident light including the optical signal.

2. An electro-optic amplifier as claimed in claim 1 wherein the light sensitive transistor amplifier is a transimpedance amplifier.

3. An electro-optic amplifier comprising:

a semiconductor substrate including an epilayer structure;

a phototransistor formed in the epilayer structure on the semiconductor substrate for receiving optical signals and converting the optical signals to electrical signals, the phototransistor having a base connected to a first terminal or a feedback resistor, an emitter, and a collector;

a monolithically integrated output amplifier stage formed on the semiconductor substrate and comprised of the same epilayer structure as the phototransistor;

wherein the monolithically integrated output amplifier stage is connected to the collector of the phototransistor and a second terminal of the feedback resistor; and wherein the emitter of the phototransistor is connected to an electrical ground.

4. An electro-optic amplifier as claimed in claim 3 wherein the monolithically integrated output amplifier stage includes an output transistor having a base, a collector, and an emitter and wherein the collector of the phototransistor is connected to a first terminal of a collector resistor and the base of the output transistor.

5. An electro-optic amplifier as claimed in claim 4 wherein the collector of the output transistor is connected to a power source and to the second terminal of the collector resistor.

6. An electro-optic amplifier as claimed in claim 5 wherein the emitter of the output transistor is connected to the second terminal of the feedback resistor and to the first terminal of an emitter resistor whose second terminal is connected to the electrical ground.

* * * * *